United States Patent

Stinehelfer

[11] 4,168,490
[45] Sep. 18, 1979

[54] ADDRESSABLE WORD LINE PULL-DOWN CIRCUIT

[75] Inventor: Jonathan J. Stinehelfer, Sunnyvale, Calif.

[73] Assignee: Fairchild Camera and Instrument Corporation, Mountain View, Calif.

[21] Appl. No.: 918,868

[22] Filed: Jun. 26, 1978

[51] Int. Cl.² .................. G11C 7/02; H03K 5/20; H04Q 9/00
[52] U.S. Cl. .................. 340/166 R; 365/204; 365/206; 307/238
[58] Field of Search .................. 340/166 R; 365/203–206, 189; 307/246, 263, 238

[56] References Cited

U.S. PATENT DOCUMENTS

| | | | |
|---|---|---|---|
| 3,739,355 | 6/1973 | Radcliffe | 365/206 |
| 3,786,442 | 1/1974 | Alexander et al. | 365/189 |
| 3,949,382 | 4/1976 | Yasui | 365/204 |
| 4,119,870 | 10/1978 | Zibert | 365/204 |
| 4,119,871 | 10/1978 | Zibert | 307/238 |

*Primary Examiner*—Donald J. Yusko
*Attorney, Agent, or Firm*—Alan H. MacPherson; Robert C. Colwell; Paul J. Winters

[57] ABSTRACT

Computer circuitry for rapidly discharging the deselected word lines in high-speed very low power random access memories that may be accidentally triggered by noise pulses if permitted to decay at the normal rate.

5 Claims, 5 Drawing Figures

— PRIOR ART —

ADDRESSABLE WORD LINE PULL-DOWN CIRCUIT

BRIEF SUMMARY OF THE INVENTION

This invention relates generally to circuitry for use with computer memories and particularly to a circuit that improves the speed and performance of a random access memory by rapidly discharging the current from the deselected word lines.

Most present day digital computers employ semiconductor random access memories formed by a plurality of memory cells, each generally comprised of a pair of multiple-emitter transistors in a flip-flop configuration. The cells may be considered to be arranged in the form of an X-Y matrix of horizontal rows and vertical columns with one emitter of each transistor in each cell coupled to a horizontal word line and the second emitter of each transistor coupled to one of two vertical bit lines. The cell is read by raising the voltage on the word line while maintaining a low differential voltage on the two vertical bit lines. Data are written into a cell by similarly raising the voltage on the word line while altering the voltage on one vertical bit line whereby the transistor with the lowest emitter voltage will be turned on.

All cells in each vertical column in the memory matrix are interconnected by their respective bit line pairs so that during a writing operation, all cells in a column will be subjected to the altered bit line voltage. However, the desired cell in that column is selected only by the increased word line voltage. Therefore, it becomes apparent that after a horizontal row of cells has been read or written, it is necessary to rapidly drop the word line voltage so that the cells in that particular row will no longer be affected by voltage variations in the vertical bit lines.

The speed of the memory depends largely upon the amount of current available in the cell and it therefore becomes apparent that in very large memory arrays, the total current drain becomes an important factor. Furthermore, in very large capacity memories, it is most desirable to keep the physical size of the memory as small as possible, thereby further limiting the total current. These small very low current memories are particularly susceptible to accidental switching after their respective word lines have been deselected but before the word line voltage can drop to its low standby level.

It is the object of this invention to provide circuitry that will very rapidly discharge the word lines after deselection to render the memory cells less noise sensitive and thereby improve reliability and the speed performance of a memory.

Briefly described, the invention is for circuitry for improving performance and reliability in addressing and de-addressing memory cells in semiconductor read/write memories. The circuitry is responsive to the energized word line, or the word line decoder output, and turns on a word line current drain that remains enabled until the word line is completely discharged to its low state.

BRIEF DESCRIPTION OF THE DRAWINGS

In the drawings which illustrate a preferred embodiment of the invention.

DETAILED DESCRIPTION

Figure 1:
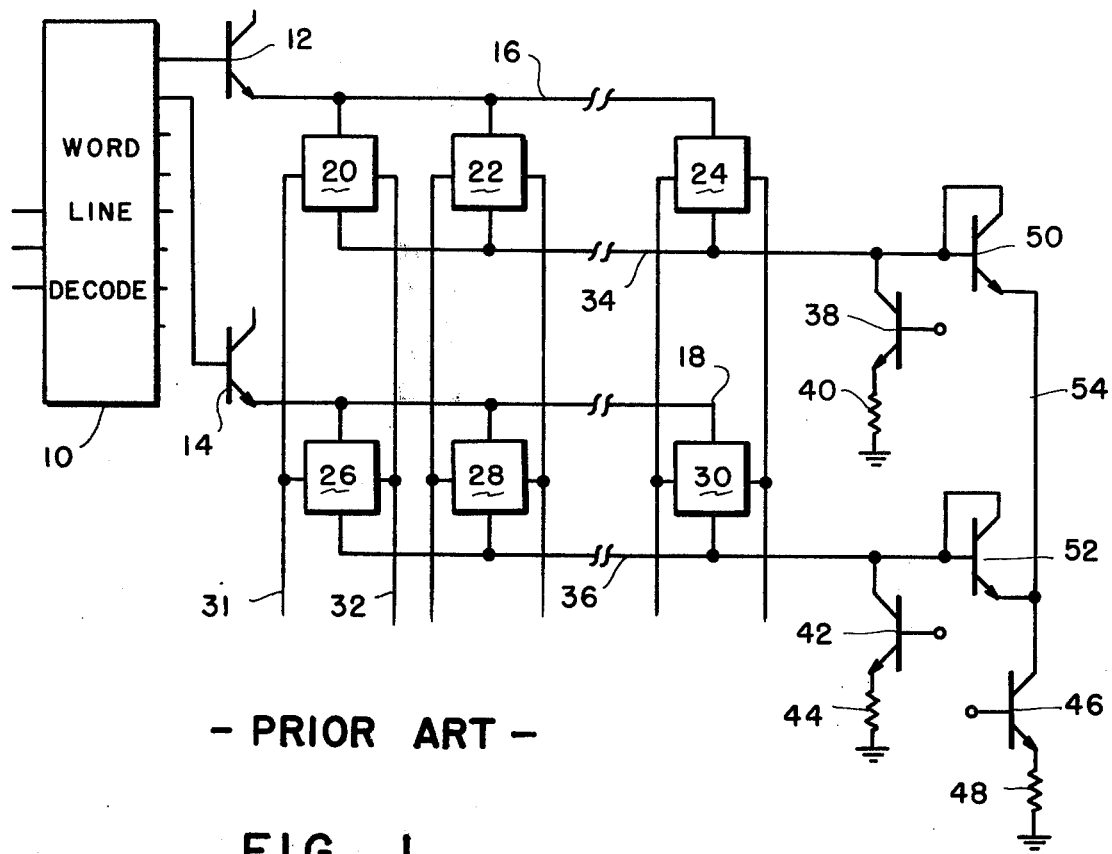
FIG. 1 is a simplified schematic diagram illustrating a typical prior art memory circuit.

Turning now to a detailed description of the invention, FIG. 1 is a simplified schematic diagram illustrating the prior art method of discharging random access memory word lines. The circuitry of FIG. 1 includes a typical word line address decoder 10 having an output terminal for each word line in the memory matrix. Signals at the output of the decoder 10 enable word line current sources, such as the transistors 12 and 14 of FIG. 1, the emitters of which are respectively coupled to upper word lines 16 and 18. Coupled to the upper word line 16 is a row of memory cells, such as cells 20, 22 and 24. Similarly, coupled to the upper word line 18 are identical cells 26, 28, and 30. Vertical columns of cells, such as the cells 20 and 26, are interconnected by bit lines 31 and 32.

Each horizontal row of cells is coupled to a lower word line. For example, all cells coupled to upper word line 16 are also coupled to the lower word line 34 and all cells coupled to the upper word line 18 are coupled to the lower word line 36. All lower word lines, such as the word lines 34 or 36, are coupled to current sources comprising a transistor switch and series resistor, such as the transistor 38, the collector of which is connected to line 34 and the emitter of which is coupled through a resistance 40 to ground reference. A similar transistor 42 and resistance 44 is coupled between word line 36 and a ground reference. The purpose of these current sources is to maintain a very low current through the memory cells to preserve the data stored therein during deselected or standby periods and to more rapidly discharge the current during the period that the word line is selected. To assist in the rapid discharge of the word line after deselection, it is the practice in the prior art to provide a pull-down circuit comprising a parallel path to ground. In FIG. 1 this is accomplished by the circuit including the normally conductive transistor 46, the emitter of which is coupled through a resistance 48 to ground and the collector of which is coupled to each of the word lines through a diode, such as the diode connected transistor 50 in the lower word line 34 and the diode connected transistor 52 in the lower word line 36. The diodes 50 and 52 and all other diodes associated with other word lines in the matrix, form a steering "OR" tie and pass current from the selected word line through the conductor 54, the conductive transistor 46 and resistance 48 to ground.

Operation of the prior art circuit is as follows: Assume initially that the upper word line 16 is selected and the upper word line 18 is deselected. Therefore, the corresponding word line 34 is high and the lower word line 36 is low. This condition is illustrated at time, T1, in FIG. 2. At time, T2, word line 34 becomes deselected and word line 36 is selected between times. Between times T2 and T3, the voltage on the word line 34 is falling rapidly from its selected high value of approximately 3.5 volts toward its low standby value of approximately 2.5 volts and the word line 36 rises rapidly. At time T3, the levels of lines 34 and 36 are equal, the diodes 50 and 52 pass equal currents, and the pull-down of word line 34 is being properly accomplished. However, as the level of word line 36 increases, it increases the voltage level on conductor 54 and, therefore, the diode 50 becomes reversed biased and is effectively cut off. Since diode 50 is no longer conductive after time T3, all current discharge from the lower word line 34 passes through the transistor 38 and resistor 50, thereby slowing the discharge rate so that word line 34 finally reaches its low state at time T4. To briefly review: Between times T2 and T3, there are two current paths to pull down the level of the word line 34. Between times T3 and T4 there is only one "keep alive", low current path and there is a consequent slower discharge of the word line.

Figure 2:
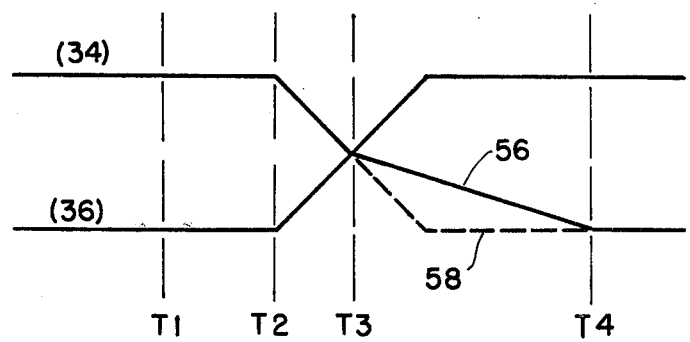
FIG. 2 is a typical voltage level vs. time diagram for explaining the operation of the circuitry of FIG. 1.

The slow pull-down of the word line 34 between times T3 and T4 of FIG. 2 presents serious problems in high-speed low current memory systems. The area bounded by the dashed line 58, which represents the ideal pull-down curve, and the slow pull-down curve 56 represents an area of low noise margins where the slightest circuit noises that may, for example, result from switching of adjacent circuits may switch one or more cells associated with the lower word line 34 and thereby degrade the performance and reliability of the memory.

Figure 3:
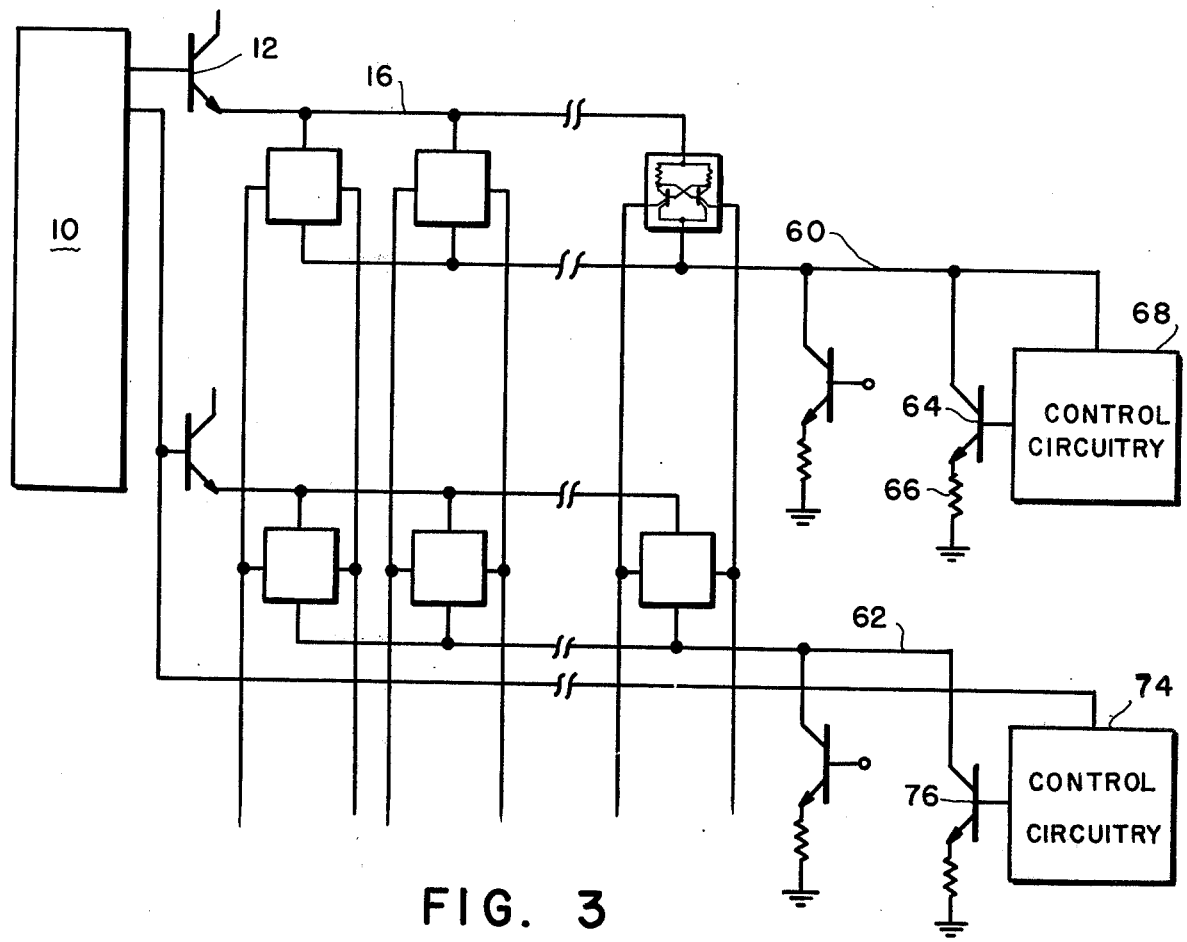
FIG. 3 is a schematic block diagram of the circuitry of the invention.

FIG. 3 is a simplified schematic diagram of the circuitry of the invention and shows circuitry substantially identical with that illustrated in FIG. 1 but with an improved word line pull-down circuit that speeds the discharge of the word lines so that a discharge curve will approximately follow the dashed line 58 of FIG. 2. As illustrated in FIG. 3, each of the word lines 60 and 62 are provided with separate, equally effective, pull-down circuits, each controlled from different sources. The circuit associated with the word line 60 comprises a transistor 64, the collector of which is coupled to the word line 60 and the emitter of which is coupled through a resistance 66 to ground reference. The base electrode of the transistor 64 is coupled to control circuitry 68 which receives input from the word line 60 and which maintains conduction through the transistor 64 until the word line 60 is in its low state. Thus, while a deselected word line had two current paths only between the times T2 and T3 in the prior art circuit, the improved circuitry of FIG. 3 provides two discharge paths from time T2 until the word line has completely discharged to its low level.

Figure 4:
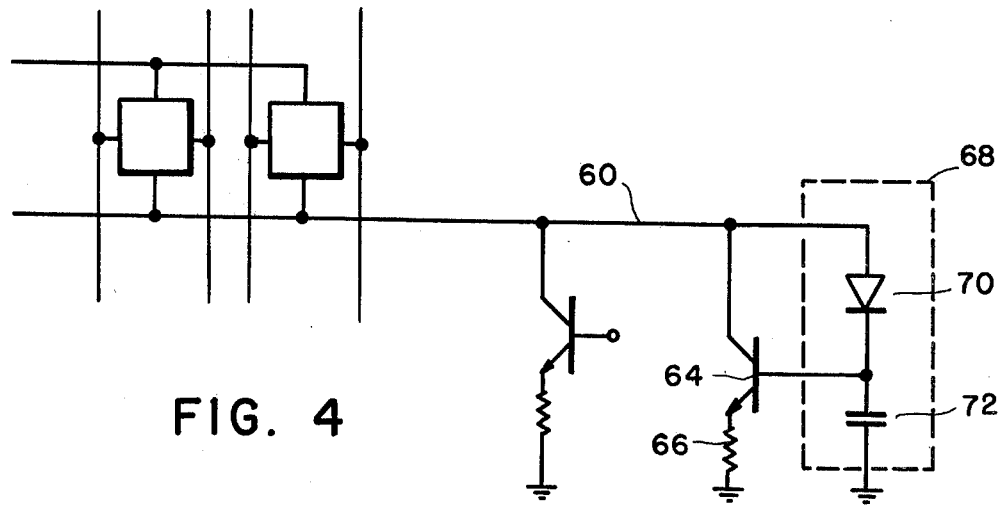
FIG. 4 is a schematic block diagram of a portion of the circuitry of FIG. 3 and illustrates a current pull-down circuit in accordance with the invention.

FIG. 4 illustrates a very simple but effective control circuit for controlling the transistor 64 of FIG. 3. In FIG. 4, the control circuit comprises a diode 70, the anode of which is connected to the word line 60 and the cathode of which is connected to the base of transistor 64 and one end of a capacitor 72, the opposite end of which is grounded. The capacitor 72 is selected so that it will become charged during the high state of the word line 60 and, upon deselection of that word line, sufficient charge will remain in the capacitor 72 to maintain transistor 64 in its conductive state until the word line 60 is completely discharged to its low state.

Returning to FIG. 3, it can be seen that the control circuitry 74 of FIG. 3 is connected to the output of the word line decoder 10 so that it may receive the address signal that selects the word line 62. Control circuitry 72 may be identical with the control circuitry 68 but may require a small buffer amplifier to charge the capacitor 72 which provides the base drive current for the transistor 76.

Figure 5:
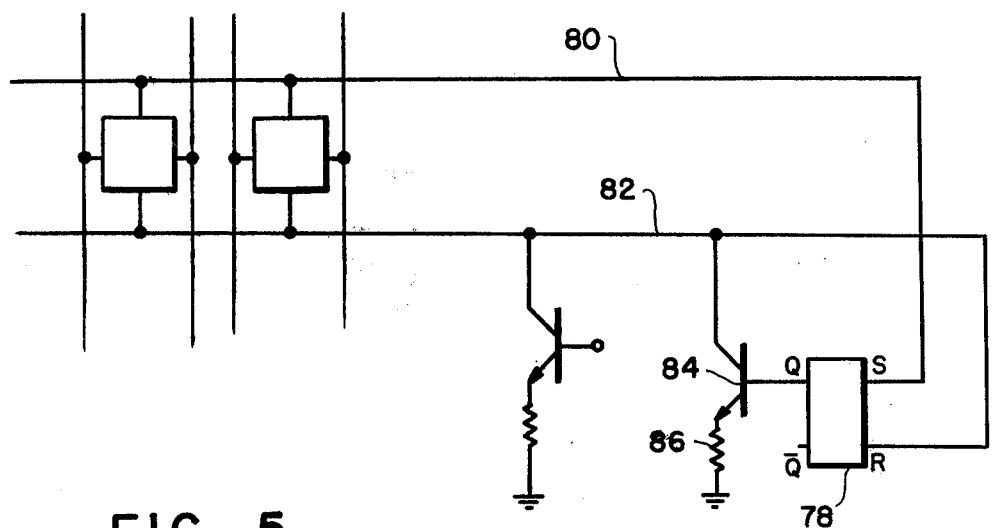
FIG. 5 is a schematic block diagram illustrating an alternate embodiment of a pull-down circuit.

FIG. 5 illustrates another simple and effective control circuit and includes an RS flip-flop 78, the "set" input of which is coupled to the upper word line 80 and the "reset" input of which is connected to the lower word line 82. The true "Q" output of flip-flop 78 is connected to the base of NPN transistor 84, the collector of which is coupled to the lower word line 82 and the emitter of which is coupled to ground reference through a resistance 86.

In operation, flip-flop 78 is set when upper word line 80 goes high and the output turns on the current source switch transistor 84 to pull-down the lower word line 82. When the address is changed, upper word line 80 goes to its low state, and the current through transistor rapidly pulls down both word lines and "deaddresses" the associated cells. When lower word line 82 is fully discharged, the flip-flop 78 is reset, thereby turning off the transistor 84.

Having thus described my invention, what is claimed is:

1. Word line pull-down circuitry for rapidly discharging a deselected word line of a random access memory, said circuitry comprising:
   a transistor switch coupled between the word line and ground reference; and
   control circuitry responsive to the selection of said word line and coupled to said switch for maintaining said switch in a conductive state during the period of said selection and thereafter during an interval required for discharging said word line to its low state.

2. The circuitry claimed in claim 1 wherein said control circuit is coupled to the output of a word line decoder and is responsive to the selection signal therefrom.

3. The circuitry claimed in claim 1 wherein said transistor switch is coupled to ground reference through a resistance.

4. The circuitry claimed in claim 3 wherein said control circuit is coupled between said word line and ground reference and includes a capacitor that is charged during said period of word line selection and, upon deselection of said word line discharges to provide base drive current to maintain said transistor switch in a conductive state.

5. The circuitry claimed in claim 3 wherein said control circuitry comprises a flip-flop circuit that is set by the signal from the upper word line interconnecting the output of a word line decoder with the memory cells and is reset by the signal on a lower word line intercoupling said cells to ground reference through said pull-down circuitry, the true output of said flip-flop controlling said transistor switch coupled between said lower word line and said ground reference.

* * * * *